United States Patent
Yao et al.

(10) Patent No.: US 12,538,841 B2
(45) Date of Patent: Jan. 27, 2026

(54) QUASI-MONOLITHIC DIE ARCHITECTURES

(71) Applicant: Intel Corporation, Santa Clara, CA (US)

(72) Inventors: Jimin Yao, Chandler, AZ (US); Adel A. Elsherbini, Chandler, AZ (US); Xavier Francois Brun, Hillsboro, OR (US); Kimin Jun, Portland, OR (US); Shawna M. Liff, Scottsdale, AZ (US); Johanna M. Swan, Scottsdale, AZ (US); Yi Shi, Chandler, AZ (US); Tushar Talukdar, Wilsonville, OR (US); Feras Eid, Chandler, AZ (US); Mohammad Enamul Kabir, Portland, OR (US); Omkar G. Karhade, Chandler, AZ (US); Bhaskar Jyoti Krishnatreya, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 582 days.

(21) Appl. No.: 17/821,001

(22) Filed: Aug. 19, 2022

(65) Prior Publication Data

US 2024/0063178 A1    Feb. 22, 2024

(51) Int. Cl.
*H01L 25/065* (2023.01)
*H01L 23/00* (2006.01)
*H01L 23/31* (2006.01)

(52) U.S. Cl.
CPC ...... *H01L 25/0652* (2013.01); *H01L 23/3107* (2013.01); *H01L 24/08* (2013.01);
(Continued)

(58) Field of Classification Search
CPC ......... H01L 24/08; H01L 24/16; H01L 24/05; H01L 24/13; H01L 24/80;
(Continued)

(56) References Cited

U.S. PATENT DOCUMENTS 9,806,061 B2   10/2017   Shen
9,842,820 B1   12/2017   Shen
(Continued)

FOREIGN PATENT DOCUMENTS

CN    113035801 A  *  6/2021  ......... H01L 23/4334
EP     3772098 A1  *  2/2021  ......... H01L 23/5384

OTHER PUBLICATIONS

U.S. Appl. No. 17/347,394, filed Jun. 14, 2022 and entitled Microelectronic Assemblies Having a Hybrid Bonded Interposer for Die-To-Die Fan-Out Scaling.
(Continued)

*Primary Examiner* — Scott B Geyer
(74) *Attorney, Agent, or Firm* — Akokna IP PC

(57) ABSTRACT

Microelectronic assemblies, related devices and methods, are disclosed herein. In some embodiments, a microelectronic assembly may include a first die and a through-dielectric via (TDV) surrounded by a dielectric material in a first layer, where the TDV has a greater width at a first surface and a smaller width at an opposing second surface of the first layer; a second die, surrounded by the dielectric material, in a second layer on the first layer, where the first die is coupled to the second die by interconnects having a pitch of less than 10 microns, and the dielectric material around the second die has an interface seam extending from a second surface of the second layer towards an opposing first surface of the second layer with an angle of less than 90 degrees relative to the second surface; and a substrate on and coupled to the second layer.

20 Claims, 12 Drawing Sheets

(52) U.S. Cl.
CPC .............. *H01L 24/16* (2013.01); *H01L 24/05* (2013.01); *H01L 24/13* (2013.01); *H01L 2224/05605* (2013.01); *H01L 2224/05609* (2013.01); *H01L 2224/05611* (2013.01); *H01L 2224/05613* (2013.01); *H01L 2224/05639* (2013.01); *H01L 2224/05644* (2013.01); *H01L 2224/05647* (2013.01); *H01L 2224/08145* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13147* (2013.01); *H01L 2224/13155* (2013.01); *H01L 2224/16227* (2013.01); *H01L 2225/06548* (2013.01)

(58) Field of Classification Search
CPC . H01L 2224/05605; H01L 2224/05609; H01L 2224/05611; H01L 2224/05613; H01L 2224/05639; H01L 2224/05644; H01L 2224/05647; H01L 2224/08145; H01L 2224/13109; H01L 2224/13111; H01L 2224/13113; H01L 2224/13116; H01L 2224/13118; H01L 2224/13139; H01L 2224/13147; H01L 2224/13155; H01L 2224/16227; H01L 2224/80895; H01L 2224/80896; H01L 23/28–3192; H01L 21/56–568; H01L 2924/181–186; H01L 25/0652; H01L 25/50; H01L 2225/06548; H01L 2225/06524; H01L 2225/06586; H01L 2225/06517; H01L 2225/06541
See application file for complete search history.

(56) References Cited

U.S. PATENT DOCUMENTS

| | | | |
|---|---|---|---|
| 10,872,872 | B2 | 12/2020 | May et al. |
| 11,694,959 | B2* | 7/2023 | Ganesan ................ H01L 24/97 |
| | | | 257/668 |
| 2004/0018696 | A1 | 1/2004 | Wieczorek et al. |
| 2007/0086168 | A1 | 4/2007 | Khanna et al. |
| 2013/0249085 | A1* | 9/2013 | Ide ...................... H01L 25/0657 |
| | | | 257/737 |
| 2016/0260685 | A1* | 9/2016 | Tremlett ................ H01L 25/105 |
| 2018/0061775 | A1 | 3/2018 | Velez et al. |
| 2019/0131242 | A1* | 5/2019 | Lee ..................... H01L 23/3128 |
| 2020/0118973 | A1 | 4/2020 | Wang et al. |
| 2021/0028080 | A1* | 1/2021 | Pietambaram ...... H01L 21/6835 |
| 2021/0035911 | A1 | 2/2021 | Ganesan et al. |
| 2021/0057381 | A1 | 2/2021 | Brun et al. |
| 2021/0134704 | A1 | 5/2021 | Chen et al. |
| 2021/0159179 | A1 | 5/2021 | Elsherbini et al. |
| 2021/0257335 | A1 | 8/2021 | Shih |
| 2021/0305162 | A1* | 9/2021 | Ganesan ............. H01L 21/6835 |
| 2022/0344304 | A1* | 10/2022 | Pan ..................... H01L 23/3135 |
| 2022/0392855 | A1* | 12/2022 | Darmawikarta ........ H01L 25/16 |
| 2023/0136656 | A1* | 5/2023 | Lai .......................... H01L 25/50 |
| | | | 257/712 |

OTHER PUBLICATIONS

U.S. Appl. No. 17/891,530, filed Aug. 19, 2022, Adel A. Elsherbini.
U.S. Appl. No. 17/891,536, filed Aug. 19, 2022, Adel A. Elsherbini.
U.S. Appl. No. 17/891,560, filed Aug. 19, 2022, Adel A. Elsherbini.
U.S. Appl. No. 17/891,654, filed Aug. 19, 2022, Adel A. Elsherbini.
U.S. Appl. No. 17/891,666, filed Aug. 19, 2022, Adel A. Elsherbini.
U.S. Appl. No. 17/891,690, filed Aug. 19, 2022, Adel A. Elsherbini.
U.S. Appl. No. 17/891,704, filed Aug. 19, 2022, Adel A. Elsherbini.
U.S. Appl. No. 17/891,727, filed Aug. 19, 2022, Adel A. Elsherbini.
U.S. Appl. No. 17/891,735, filed Aug. 19, 2022, Adel A. Elsherbini.
U.S. Appl. No. 17/891,738, filed Aug. 19, 2022, Adel A. Elsherbini.
U.S. Appl. No. 17/891,880, filed Aug. 19, 2022, Adel A. Elsherbini.

* cited by examiner

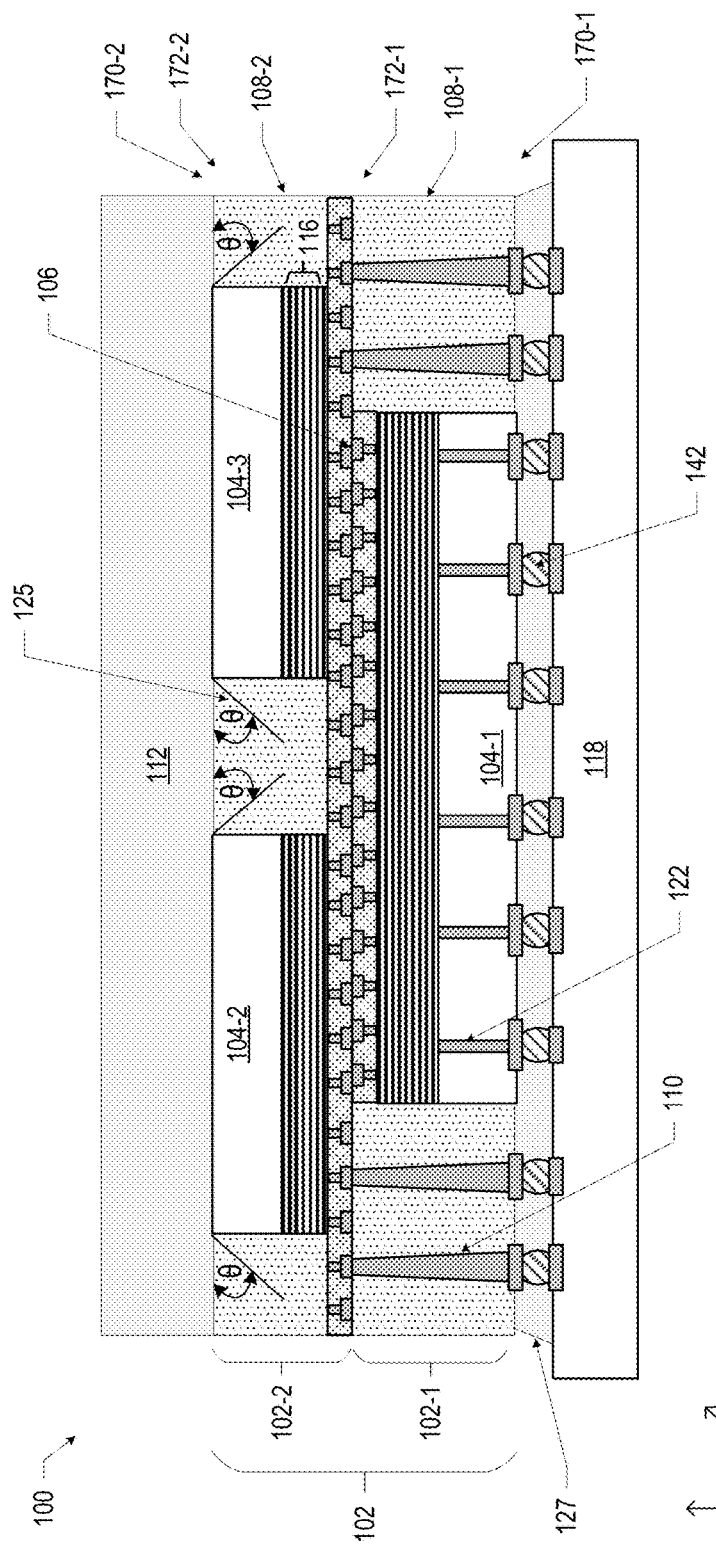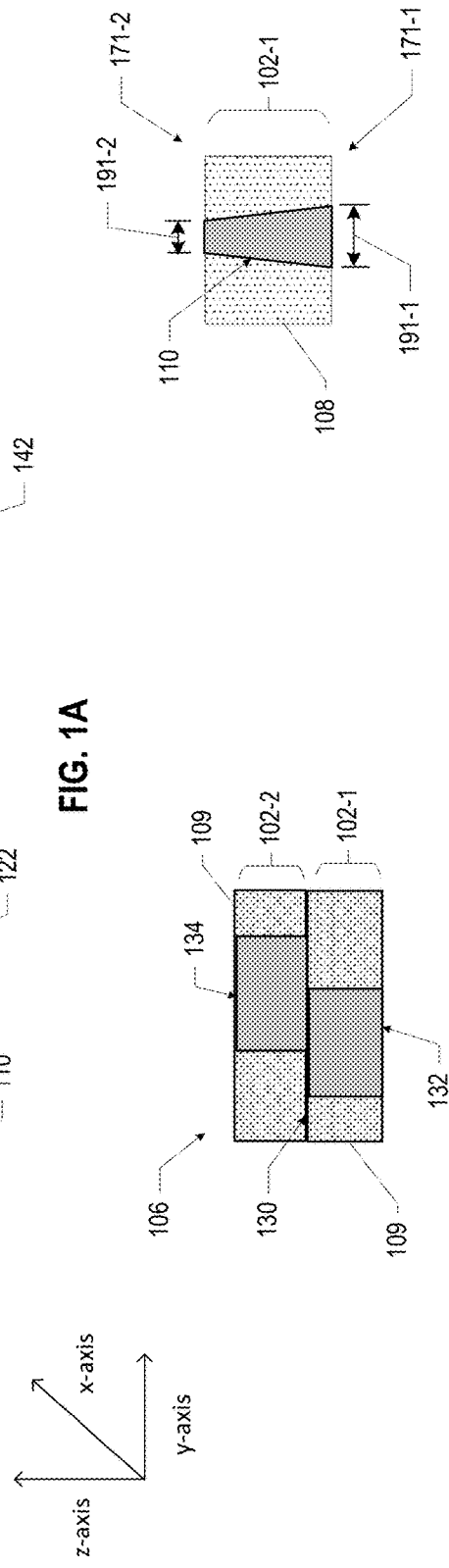
FIG. 1A
FIG. 1B
FIG. 1C

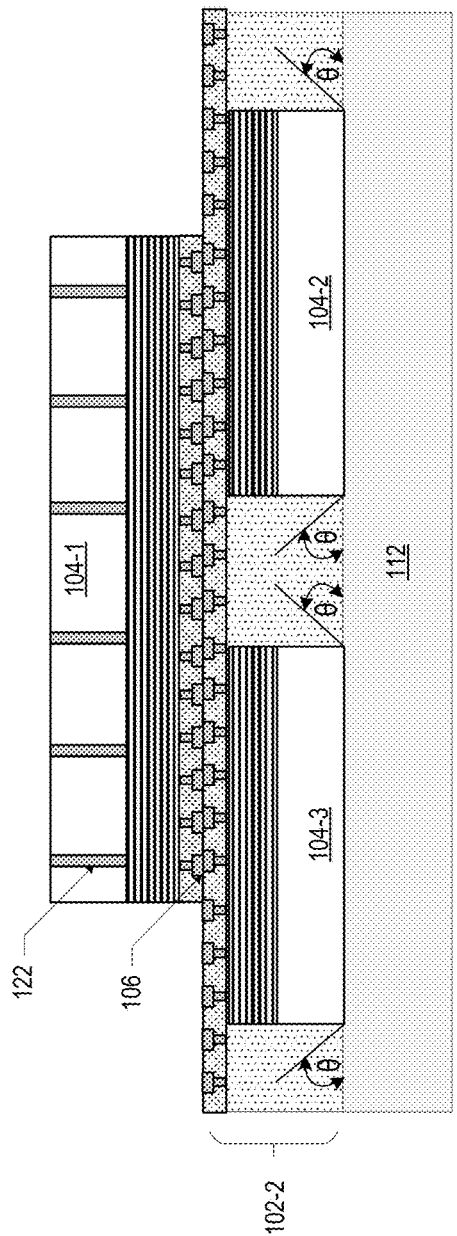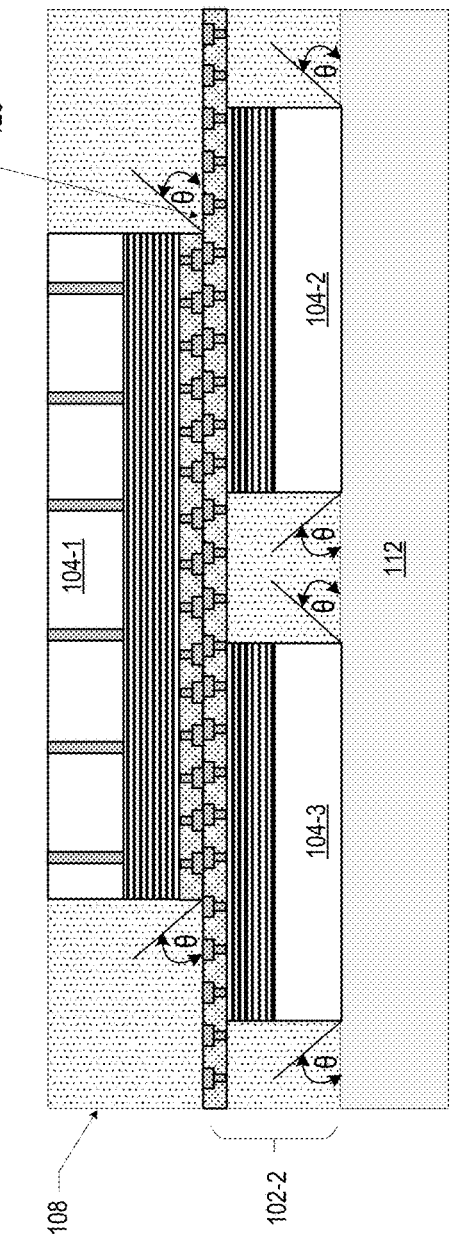

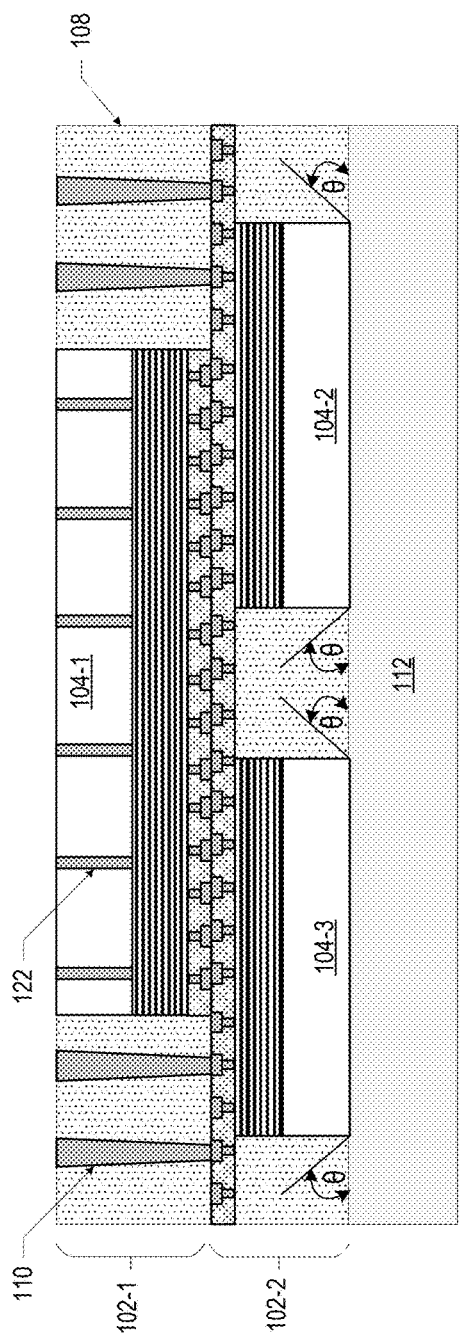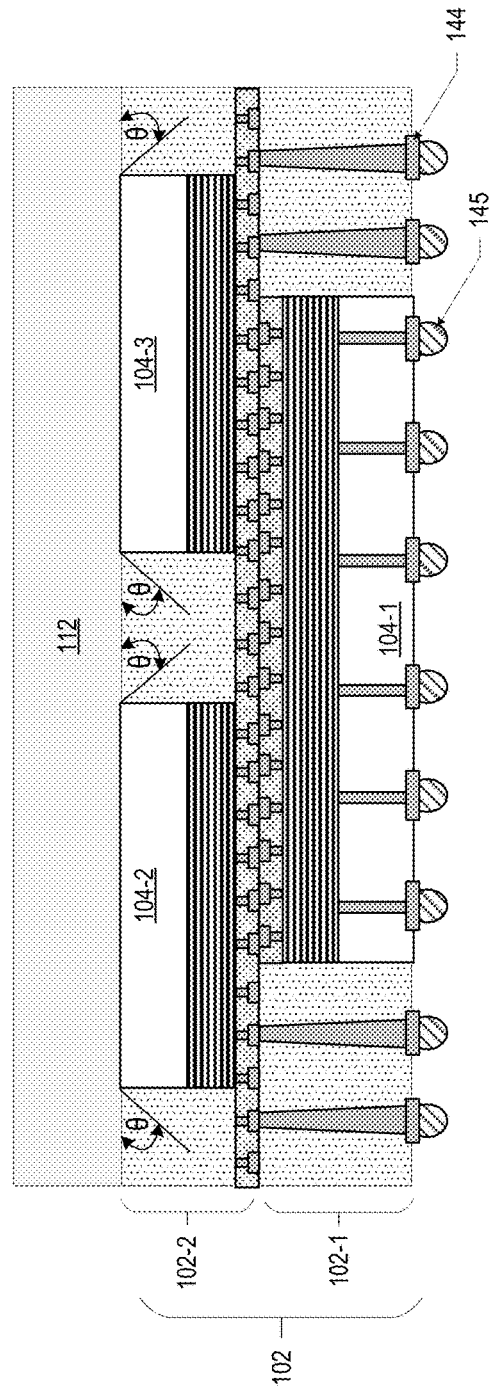

QUASI-MONOLITHIC DIE ARCHITECTURES

TECHNICAL FIELD

The present disclosure relates to techniques, methods, and apparatus directed to quasi-monolithic die architecture in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a schematic cross-sectional view of an example microelectronic assembly according to some embodiments of the present disclosure.

FIG. 1B is a schematic cross-sectional view of a portion of the example microelectronic assembly of FIG. 1A.

FIG. 1C is a schematic cross-sectional view of a portion of the example microelectronic assembly of FIG. 1A.

FIGS. 6A-6H are schematic cross-sectional views of different stages of an example process for manufacturing the microelectronic assembly of FIG. 1A according to some embodiments of the present disclosure.

DETAILED DESCRIPTION

Figure 2:
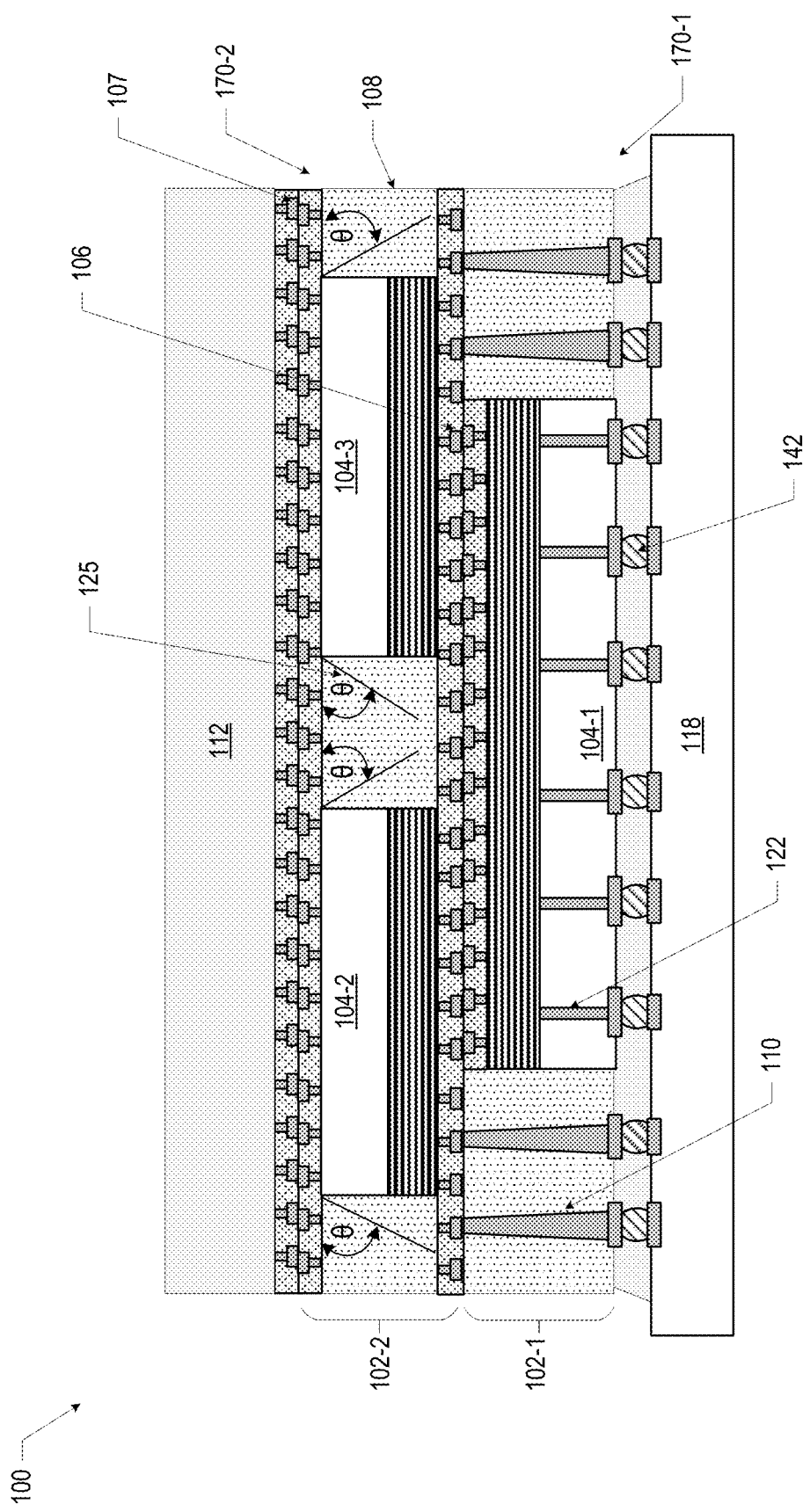
FIG. 2 is a schematic cross-sectional view of another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuit elements in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

In one aspect of the present disclosure, an example of quasi-monolithic die architecture includes recursively coupling a plurality of IC dies to form microelectronic assemblies of a processing system. The plurality of IC dies may comprise active dies and/or passive dies, and at least a portion of the plurality of dies are coupled using high-density interconnects. As used herein, "high-density interconnects" include die-to-die (DTD) interconnects having a pitch of less than 10 microns. As used herein, pitch is measured center-to-center (e.g., from a center of an interconnect to a center of an adjacent interconnect). In some embodiments, two interconnects may form a single interconnect (e.g., a double interconnect).

Accordingly, microelectronic assemblies, related devices and methods, are disclosed herein. In some embodiments, a microelectronic assembly may include a first die and a through-dielectric via (TDV) surrounded by a dielectric material in a first layer, where the TDV has a greater width at a first surface and a smaller width at an opposing second surface of the first layer; a second die, surrounded by the dielectric material, in a second layer on the first layer, where the first die is coupled to the second die by interconnects having a pitch of less than 10 microns, and the dielectric material around the second die has an interface seam extending from a second surface of the second layer towards an opposing first surface of the second layer with an angle of less than 90 degrees relative to the second surface; and a substrate on and coupled to the second layer.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. A dielectric material may include any suitable dielectric material commonly used in semiconductor manufacture, such as silicon and one or more of oxygen, nitrogen, hydrogen, and carbon (e.g., in the form of silicon oxide, silicon nitride, silicon oxynitride, or silicon carbon nitride); a polyimide material; or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 1A-1C), such a collection may be referred to herein without the letters (e.g., as "FIG. 1"). Similarly, if a collection of reference numerals designated with different numerals or letters are present (e.g., 104-1, 104-2, 104-3), such a collection may be referred to herein without the numerals or letters (e.g., as "104").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1A is a schematic cross-sectional view of an example microelectronic assembly 100 according to some embodiments of the present disclosure. Microelectronic assembly 100 comprises a plurality of layers 102 (e.g., 102-1 and 102-2) of IC dies 104 (e.g., 104-1, 104-2, 104-3), each layer 102 coupled to adjacent layers 102 by interconnects 106. In various embodiments, interconnects 106 may be FLI with a pitch of less than 10 micrometers between adjacent interconnects. An example of interconnect 106 in some embodiments is a hybrid bond, comprising metal-metal and dielectric-dielectric bonds. In the example shown in the figure, the number of layers 102 is two: a first layer 102-1 and a second layer 102-2. In various other embodiments, microelectronic assembly 100 may include two or greater number of layers 102. In some embodiments, each layer 102 may comprise an interface layer (not shown for ease of illustration and so as not to clutter the drawings) on either side, the interface layer comprising the metal material and dielectric material of interconnects 106. The plurality of layers 102 may have a first surface 170-1 (e.g., a bottom surface) and an opposing second surface 170-2 (e.g., a top surface).

In various embodiments, one or more of the plurality of layers 102 may include a dielectric material 108 around (e.g., between, surrounding, etc.) IC dies 104. In the example shown, layer 102-1 includes a first dielectric material 108-1 around die 104-1 and the second layer 102-2 has a second dielectric material 108-2 around IC dies 104-2, 104-3. The dielectric material 108-2 around die 104-2 may include an interface seam 125 extending from the second die 104-2 at the second surface 172-2 of layer 102-2 towards the first surface 172-1 of the layer 102-2 having an angle (θ) of less than 90 degrees relative to the second surface of the layer 102-2. In some embodiments, the interface seam 125 may have an angle between 25 degrees and 65 degrees (e.g., between 35 degrees and 55 degrees) relative to the second surface of the layer. As shown in FIG. 1A, the dielectric material 108-2 may include more than one interface seam 125 extending from the dies 104-2, 104-3 at the second surface 172-2 of layer 102-2 towards the first surface 172-1 of the layer 102-2 having an angle of less than 90 degrees relative to the second surface of the layer 102-2. In other embodiments where there are a greater number of layers 102, the dielectric material 108 in the other layers may include an interface seam 125 extending from IC die 104 at a second surface of the layer 102 towards the first surface of the layer 102 having an angle of less than 90 degrees relative to the second surface of the respective layer. An interface seam 125 may be formed as described below with reference to FIG. 6. In other embodiments where there are a greater number of layers 102, dielectric material 108 may not be present around IC dies 104 in one or more such layers 102. One or more through-dielectric vias (TDVs) 110 may be present in dielectric material 108 in layers 102. In various embodiments, dielectric material 108 comprises inorganic materials, for example, silicon and one or more of oxygen, nitrogen, hydrogen, and carbon (e.g., in the form of silicon oxide, silicon nitride, or silicon carbide), and/or other forms of inorganic dielectric material typically used as interlayer dielectric (ILD) in semiconductor devices.

Figure 3:
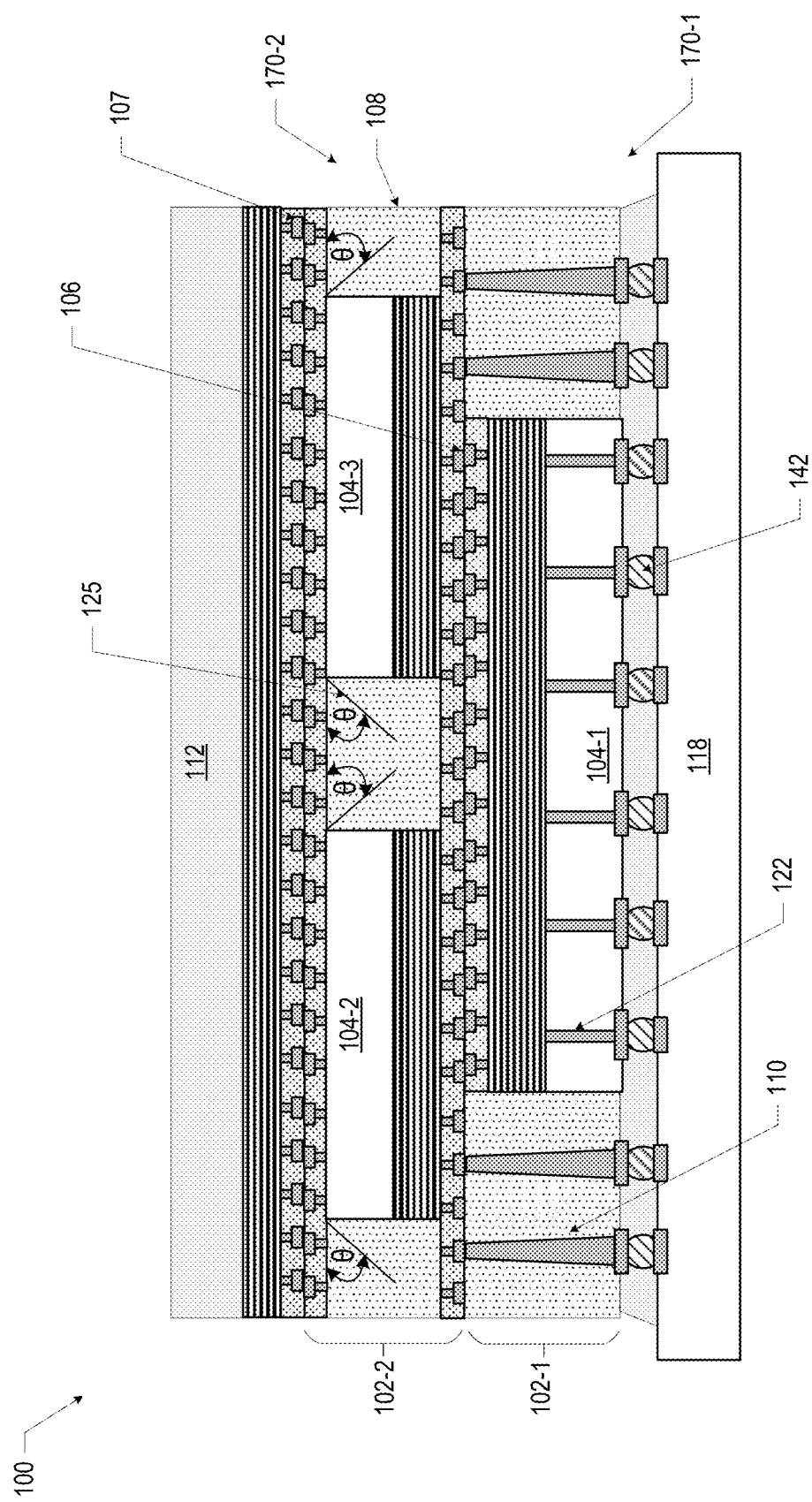
FIG. 3 is a schematic cross-sectional view of yet another example microelectronic assembly according to some embodiments of the present disclosure.

A substrate 112 may be coupled to a second surface 170-2 of the plurality of layers 102. In some embodiments, the substrate 112 may comprise a structurally stiff and thermally conductive base, such as silicon, that may provide mechanical support and stability to the plurality of layers 102. In various embodiments, the substrate 112 may comprise a wafer of silicon cut to suitable proportions to fit over layers 102. The substrate 112 may be coupled to the second surface 170-2 of the layer 102-2 by fusion bonding (i.e., dielectric-dielectric bonds with no metal-metal bonds at the interface). In some embodiments, as shown in FIG. 1A, the substrate 112 may not include devices and/or metal traces. In other embodiments (e.g., as shown in FIG. 3), the substrate 112 may include devices and/or metal traces, such that the substrate 112 is electrically coupled to the second surface 170-2 of the second layer 102-2 by interconnects (e.g., interconnects 106).

In some embodiments (as shown), one or more IC dies 104 (e.g., 104-1) in some layers 102 (e.g., 102-1), may include through-substrate vias (TSVs) 122. TSVs 122 may be configured to carry power, signals and/or ground connection between package substrate 118 and IC dies 104 in the plurality of layers 102. In various embodiments, one or more IC die 104 in microelectronic assembly 100 may include different kinds of conductive traces, such as conductive traces configured to carry power and conductive traces configured to carry signals, having different dimensions (e.g., conductive traces configured to carry power may, in general, be larger (e.g., thicker, wider) than conductive traces configured to carry signals). Conductive traces may be present in a metallization stack 116 having a plurality of metal layers through insulator fabricated using known semiconductor manufacturing processes. In some embodiments, the insulator material in the metallization stacks may be the same as that of the dielectric material 108 around IC dies 104; in other embodiments, the insulator material in the metallization stacks may be different from that of dielectric material 108 around IC dies 104.

In the example embodiment shown in the figure, the metallization stacks 116 of the IC dies 104 are face-to-face (e.g., metallization stack 116 of IC die 104-1 faces and is coupled to the metallization stacks 116 of IC dies 104-2, 104-3). In other embodiments, the metallization stacks 116 of the IC dies 104 are face-to-back (not shown) (e.g., the metallization stack 116 of IC die 104-1 may face away from the metallization stacks 116 of the IC dies 104-2, 104-3, such that the IC dies 104-2, 104-3 are coupled to the TSVs 122 of the IC dies 104-1).

FIG. 1B is a schematic cross-sectional view of a detail of a particular one of interconnects 106 in microelectronic assembly 100. Note that although only interconnect 106 is shown, the same structure and description may apply to any other such interconnects comprising hybrid bonds in microelectronic assembly 100 where applicable. In a general sense, interconnect 106 may include, at an interface 130 between layers 102-1 and 102-2, metal-metal bonds between bond-pad 132 of layer 102-1 and bond-pad 134 of layer 102-2, and dielectric-dielectric bonds (e.g., oxide-oxide bonds) in a dielectric material 109 of layers 102-1 and 102-2. In some embodiments, the structures as illustrated in the figure may be present in an interface layer (e.g., bonding layer 124 in FIG. 6) between layers 102-1 and 102-2. In other embodiments, the structures as illustrated in the figure may be present in IC dies 104 of the respective layers. In yet other embodiments, some structures as illustrated in the figure may be present in IC dies 104 of one of the layers, and other structures may be present outside/around IC dies 104 of the other one of the layers. Bond-pad 132 of layer 102-1 may bond with bond-pad 134 of layer 102-2. Dielectric material 109 (e.g., silicon oxide, silicon nitride, silicon oxynitride, etc.) in layers 102-1 and 102-2 may bond with each other. In some embodiments, the dielectric material 109 may be a same material as the dielectric material 108. The bonded metal and dielectric materials form interconnect 106, comprising hybrid bonds, providing electrical and mechanical coupling between layers 102-1 and 102-2. In various embodiments, interconnects 106 may have a linear dimension of less than 5 micrometers and a pitch of less than 10 micrometers between adjacent interconnects.

FIG. 1C is a schematic cross-sectional view of a detail of a particular one of TDVs 110 in microelectronic assembly 100. As shown in FIG. 1A, a TDV 110 may be included in layer 102-1 adjacent to IC die 104-1. The layer 102-1 may include a first surface 171-1 and an opposing second surface 171-2. The TDV 110 may extend through the dielectric material 108 from the first surface 171-1 to the second surface 171-2 of the layer 102-1. The TDV 110 may have a tapered or conical shape. The TDV 110 may have a greater width 191-1 (e.g., y-dimension) at the first surface 171-1 and a smaller width 191-2 at the second surface of the layer 102-1. Although FIG. 1A illustrates TDVs 110 included only in layer 102-1, any layer 102 (e.g., layer 102-2) may include TDVs 110 having a width 191-1 towards the first surface 171-1 that is greater than a width 191-2 towards the second surface 171-2.

Turning back to FIG. 1A, package substrate 118 may include conductive pathways (not shown) through an organic dielectric material. The conductive pathways may include conductive traces coupled by conductive vias. The package substrate 118 may further include bond-pads, redistribution layers, substrate cores, passive components and other elements, which are not shown merely for ease of illustration and not as limitations. Package substrate 118 may be coupled to the first surface 170-1 of the plurality of layers 102 by SLIs 142 (e.g., DTPS interconnects, such as flip-chip solder bonds). In various embodiments, SLI 142 may have a pitch greater than 10 micrometers between adjacent interconnects. An underfill material 127 may be disposed around SLIs 142. The underfill process may include dispensing underfill material in liquid form, allowing the material to flow and fill interstitial gaps around SLIs 142, and subjecting the assembly to a curing process, such as baking, to solidify the material.

FIG. 2 is a schematic cross-sectional view of another example microelectronic assembly according to some embodiments of the present disclosure. The configuration of the embodiment shown in the figure is like that of FIG. 1A, except for differences as described further. The configuration of microelectronic assembly 100 as described herein is a quasi-monolithic package architecture. Substrate 112 in traditional quasi-monolithic package architecture typically includes a silicon substrate with no devices or metal traces and the interface to the structural silicon is fusion bonding (i.e., dielectric-dielectric bonds with no metal-metal bonds at the interface, as shown in FIG. 1A). In contrast, in embodiments as described herein, substrate 112 may be electrically coupled to the second surface 170-2 of the plurality of layers 102 by interconnects 107. The interface 130 between substrate 112 and the second surface 170-2 of the plurality of layers 102 may include metal-metal and dielectric-dielectric bonds as described in FIG. 16. In some embodiments, conductive traces (not shown) may be disposed on substrate 112 proximate to the second surface 170-2 in layers 102 and electrically coupled to the second surface 170-2 of the plurality of layers 102 by interconnects 107. Interconnects 107 may improve thermal performance of the microelectronic assembly 100 by dissipating heat through the interconnects 107. In some embodiments, interconnects 107 may be of the same type and pitch as interconnects 106. In other embodiments, interconnects 107 may have different dimensions and pitch than interconnects 106. In other embodiments, the top substrate 112 may include active devices such as memory or processing logic.

FIG. 3 is a schematic cross-sectional view of another example microelectronic assembly according to some embodiments of the present disclosure. The configuration of the embodiment shown in the figure is like that of FIG. 2, except for differences as described further. Substrate 112 may further include a metallization stack 116 having a plurality of metal layers through insulator (e.g., conductive pathways formed by conductive vias and conductive traces) electrically coupled to the second surface 170-2 of the plurality of layers 102 by interconnects 107. The interface 130 between substrate 112 and the second surface 170-2 of the plurality of layers 102 may include metal-metal and dielectric-dielectric bonds as described in FIG. 16. In some embodiments, substrate 112 may further include devices, such as capacitors. In some embodiments, IC dies 104-2, 104-3 may be double-sided dies (e.g., with metallization stacks on opposing sides or with TSVs 122 similar to IC die 104-1) and the substrate 112 may be electrically coupled to transmit signals between IC dies 104-2, 104-3.

Figure 4:
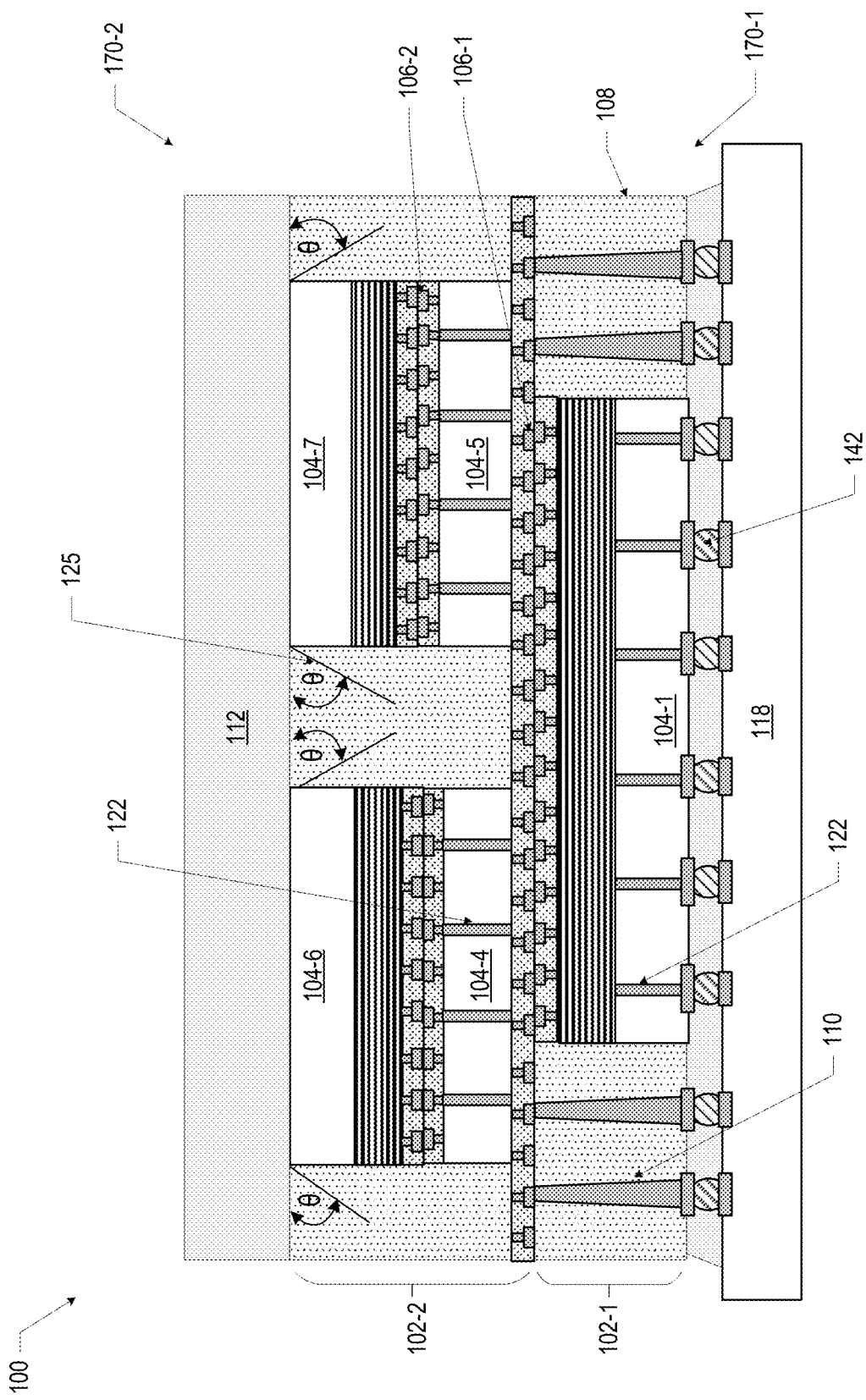
FIG. 4 is a schematic cross-sectional view of yet another example microelectronic assembly according to some embodiments of the present disclosure.

FIG. 4 is a schematic cross-sectional view of another example microelectronic assembly according to some embodiments of the present disclosure. The configuration of the embodiment shown in the figure is like that of FIG. 1A, except for differences as described further. IC dies 104 in the layer 102-2 may include a plurality of IC dies 104 that are vertically stacked and electrically coupled by interconnects 106. As shown in FIG. 4, IC dies 104-4, 104-5 may include TSVs 122 and may be electrically coupled on a bottom surface to IC die 104-1 by interconnects 106-1 and electrically coupled to IC die 104-6, 104-7, respectively, on a top surface by interconnects 106-2. The stacked IC dies (e.g., IC dies 104-4, 104-6 and IC dies 104-5, 104-7) may be preassembled prior to being integrated in microelectronic assembly 100.

Figure 5:
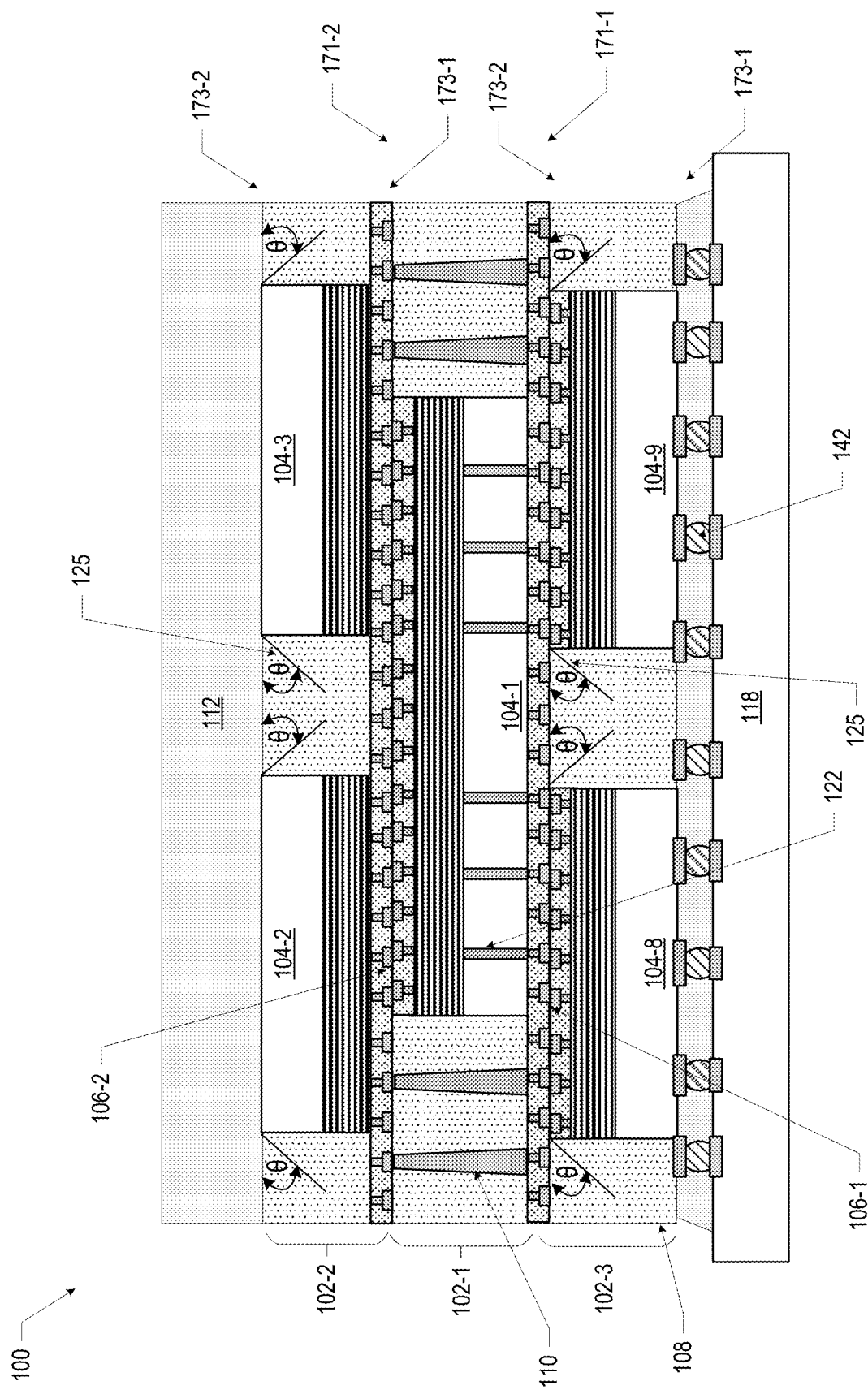
FIG. 5 is a schematic cross-sectional view of yet another example microelectronic assembly according to some embodiments of the present disclosure.

FIG. 5 is a schematic cross-sectional view of another example microelectronic assembly according to some embodiments of the present disclosure. The configuration of the embodiment shown in the figure is like that of FIG. 1A, except for differences as described further. Microelectronic assembly 100 comprises a plurality of layers 102 (e.g., 102-1, 102-2, 102-3) of IC dies 104 (e.g., 104-1, 104-2, 104-3, 104-8, 104-9), each layer 102 coupled to adjacent layers 102 by interconnects 106. In the example shown in the figure, the number of layers 102 is three: a first layer 102-1 having a first surface 171-1 and an opposing second layer 171-2, a second layer 102-2 at the second surface 171-2 of the first layer 102-1, and a third layer 102-3 at the first surface 171-1 of the first layer 102-1. In some embodiments, each layer 102 may comprise an interface layer on either side, the interface layer comprising the metal material and dielectric material of interconnects 106. In various embodiments, one or more of the plurality of layers 102 may include a dielectric material 108 around (e.g., between, surrounding, etc.) IC dies 104. In the example shown, layer 102-1 includes dielectric material 108 around die 104-1, layer 102-2 has a dielectric material 108 around IC dies 104-2, 104-3, and layer 102-3 has a dielectric material 108 around IC dies 104-8, 104-9. The dielectric material 108 around die 104-8, 104-9 may include an interface seam 125 extending from the die 104-2 at a second surface 173-2 of layer 102-3 towards a first surface 173-1 of the layer 102-3 having an angle of less than 90 degrees relative to the second surface of the layer 102-3. An interface seam 125 may have an angle between 25 degrees and 65 degrees (e.g., between 35 degrees and 55 degrees) relative to the second surface of the layer. As shown in FIG. 5, the dielectric material 108 may include more than one interface seam 125 extending from the dies 104-8, 104-9 at the second surface 173-2 of layer 102-3 towards the first surface 173-1 of the layer 102-3 having an angle of less than 90 degrees relative to the second surface of the layer 102-3. An interface seam 125 may be formed as described below with reference to FIG. 6. In some embodiments, all layers 102 of IC dies 104 may include an interface seam 125. In some embodiments, only one layer 102 of IC dies 104 may include an interface seam 125.

Any suitable techniques may be used to manufacture the microelectronic assemblies 100 disclosed herein. For example, FIGS. 6A-6H are side, cross-sectional views of various stages in an example process for manufacturing the microelectronic assembly 100 of FIG. 1A, in accordance with various embodiments. Although the operations discussed below with reference to FIGS. 6A-6H (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 6A-6H may be modified in accordance with the present disclosure to fabricate others of microelectronic assembly 100 disclosed herein.

Figure 6A:
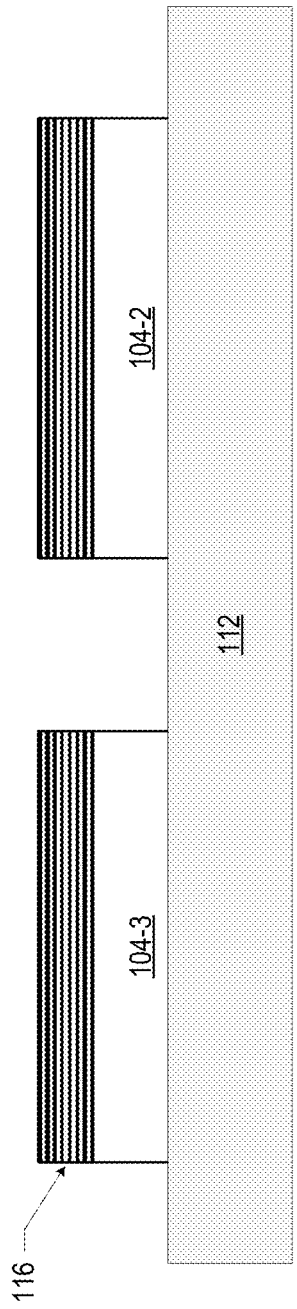

FIG. 6A illustrates an assembly subsequent to mounting IC dies 104-2, 104-3 on a substrate 112 with a metallization stack 116 facing away from the substrate 112. Any suitable method may be used to place IC dies 104-2, 104-3 for example, automated pick-and-place. A substrate 112 may include any suitable material for providing mechanical stability during manufacturing operations and use, and in some embodiments, may include silicon. In some embodiments, IC dies 104-2, 104-3 may be coupled to the substrate 112 by fusion bonding. In some embodiments, the IC dies 104-2, 104-3 may be electrically coupled to the substrate 112 by interconnects, such as interconnects 107 in FIG. 2.

Figure 6B:
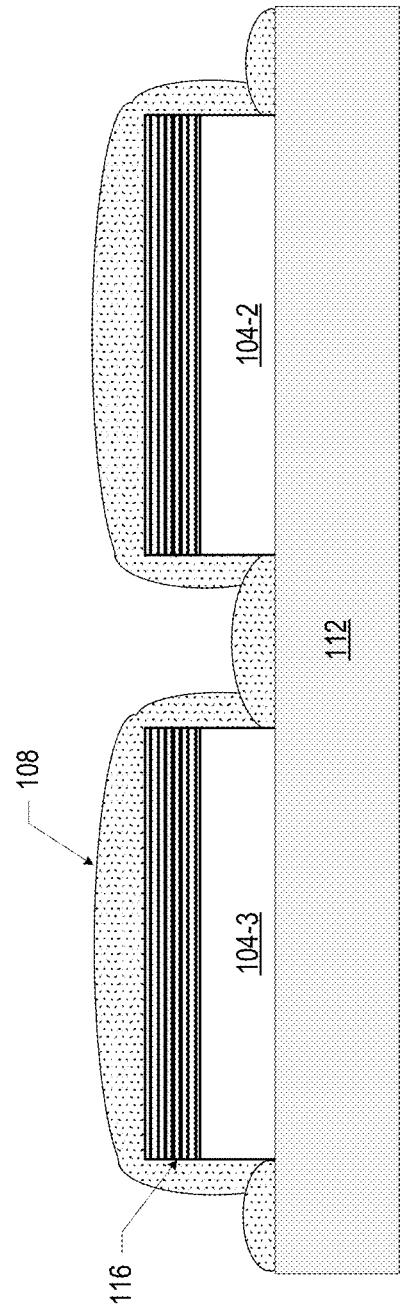

FIG. 6B illustrates an assembly during depositing a dielectric material 108 on a top surface of the assembly (e.g., on a top surface and on side surfaces of IC dies 104-2, 104-3, and on a top surface of the substrate 112). Interface seam 125 may be formed by depositing a dielectric material 108 on the surfaces of dies 104-2, 104-3 and the surface of the substrate 112. The dielectric material 108 may be deposited using any suitable technique, such as chemical vapor deposition, physical vapor deposition, plasma enhanced chemical vapor deposition, among others. In some embodiments, the dielectric material 108 may be dispensed in liquid form to flow around and conform to various shapes of components and metallization, and, subsequently, may be subjected to a process, for example, curing, that solidifies the dielectric material 108. In other embodiments, the dielectric may be deposited then reflown to improve its planarity for subsequent processing.

Figure 6C:
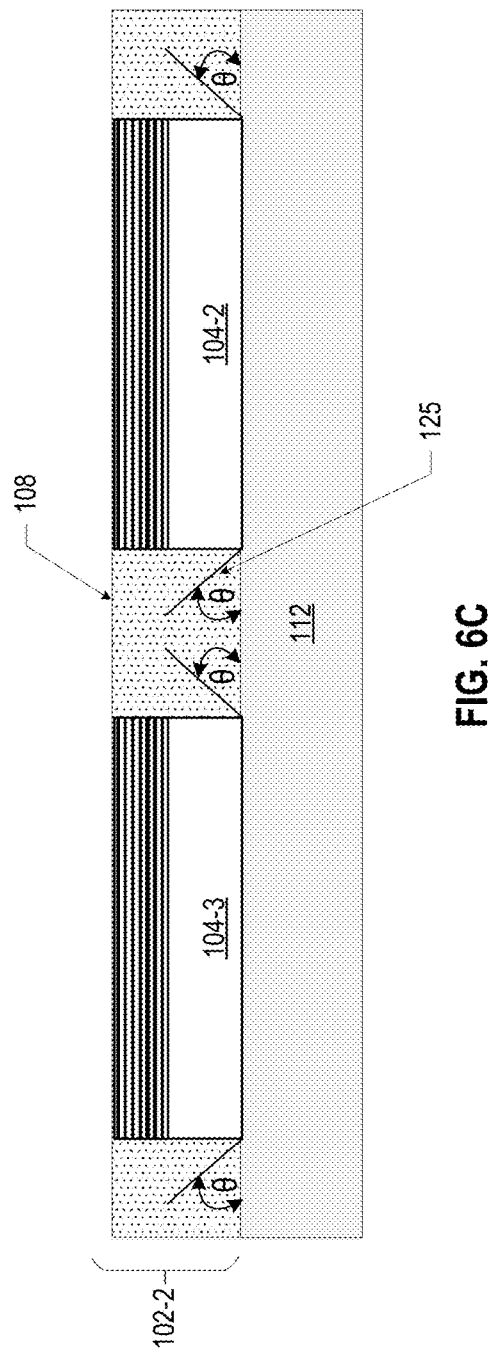

FIG. 6C illustrates an assembly subsequent to depositing the dielectric material 108 fully around and between IC dies 104-2, 104-3 and on the substrate 112 and planarizing a top surface of the assembly to remove dielectric material over the IC dies. The top surface of the assembly may be planarized to remove the dielectric 108 using any suitable technique, such as grinding or etching, and subsequently by chemical mechanical polishing (CMP).

Figure 6D:
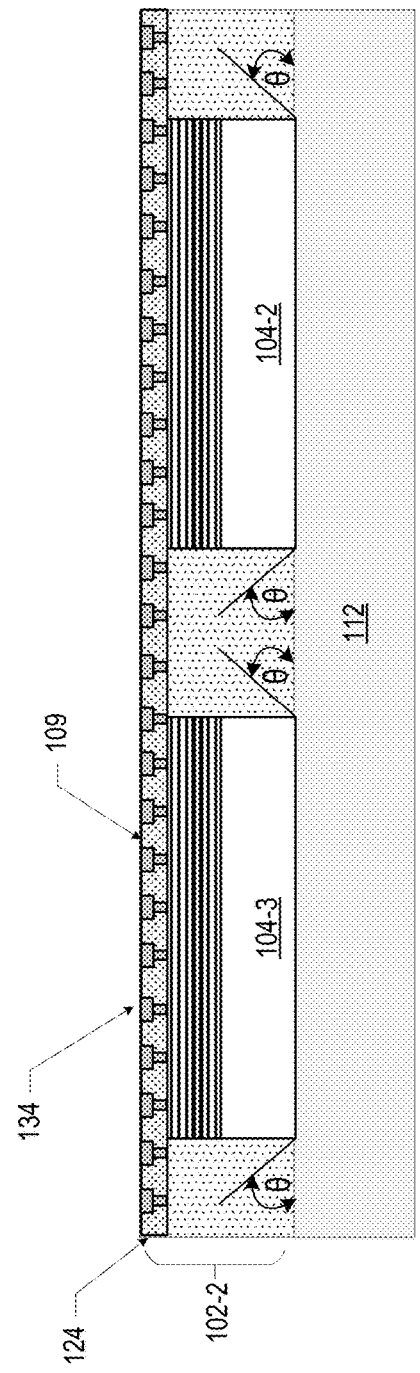

FIG. 6D illustrates an assembly subsequent to forming a bonding layer 124 on a top surface of the assembly of FIG. 6C. The bonding layer 124 may include bond-pads 134 in a dielectric material 109 that correspond to bond-pads 132, as described above with reference to FIG. 1B, for forming hybrid direct bonds (e.g., interconnects 106 as shown in FIG. 6E).

FIG. 6E illustrates an assembly subsequent to attaching IC die 104-1, which may include TSVs 122, to bonding layer 124 and forming interconnects 106. The assembly of FIG. 6E may be subjected to appropriate bonding processing to form interconnects 106. For example, the bonding process may include applying a suitable pressure and heating to a suitable temperature (e.g., to moderately high temperatures, e.g., between about 50 and 400 degrees Celsius) for a duration of time. In some embodiments, a bonding material may be applied at interface between IC die 104-1 and bonding layer 124. In some embodiments, the bonding material may be an adhesive that ensures attachment of IC die 104-1 to bonding layer 124. In other embodiments, the bonding material may be an etch-stop material. In yet other embodiments, the bonding material may be both an etch-stop material and have suitable adhesive properties to ensure attachment of IC die 104-1 to bonding layer 124. In yet other embodiments, no bonding material may be used.

FIG. 6F illustrates an assembly subsequent to disposing a dielectric material 108 on a top surface of the assembly of FIG. 6E (e.g., on and around IC die 104-1 and a top surface of the bonding layer 124). In some embodiments, dielectric material 108 around IC die 104-1 may be a same material as dielectric material 108 around IC dies 104-2, 104-3. In some embodiments, dielectric material 108 around IC die 104-1 may be a different material than dielectric material 108 around IC dies 104-2, 104-3. Any suitable technique may be used to deposit the dielectric material 108, such as the operations described above with reference to FIGS. 6B and 6C, including forming an interface seam 125.

FIG. 6G illustrates an assembly subsequent to forming via openings through the dielectric material 108, depositing a conductive material, such as a metal, in the openings to form TDVs 110, and planarizing a top surface of the assembly to remove dielectric material 108 and exposing a top surface of TDVs 110 and TSVs 122 in IC die 104-1 to form layer 102-1. TDVs 110 may be electrically coupled to bond-pads 134 in bonding layer 124. A top surface of the assembly may be planarized using any suitable technique, for example, grinding or chemical mechanical polishing (CMP). The via openings may be formed using any suitable technique, such as laser drilling, where the via opening has a tapered or conical shape. The processes described in FIGS. 6A-6F, and portions thereof, may be repeated any number of times as desired to make a microelectronic assembly 100 including any number of layers 102 and any number of IC dies 104 within in an individual layer 102.

FIG. 6H illustrates an assembly subsequent to inverting the assembly of FIG. 6G and performing finishing operations on the bottom surface of the assembly, such as forming conductive contacts 144, depositing solder resist (not shown), and depositing solder 145 on a bottom surface of conductive contacts 144. If multiple assemblies are manufactured together, the assemblies may be singulated. The assembly of FIG. 6H may itself be a microelectronic assembly 100, as shown. Further manufacturing operations may be performed on the microelectronic assembly 100 of FIG. 6H to form other microelectronic assembly 100; for example, the solder 145 may be used to couple the microelectronic assembly 100 of FIG. 6H to a package substrate 118, similar to the microelectronic assembly 100 of FIG. 1A.

Figure 7:
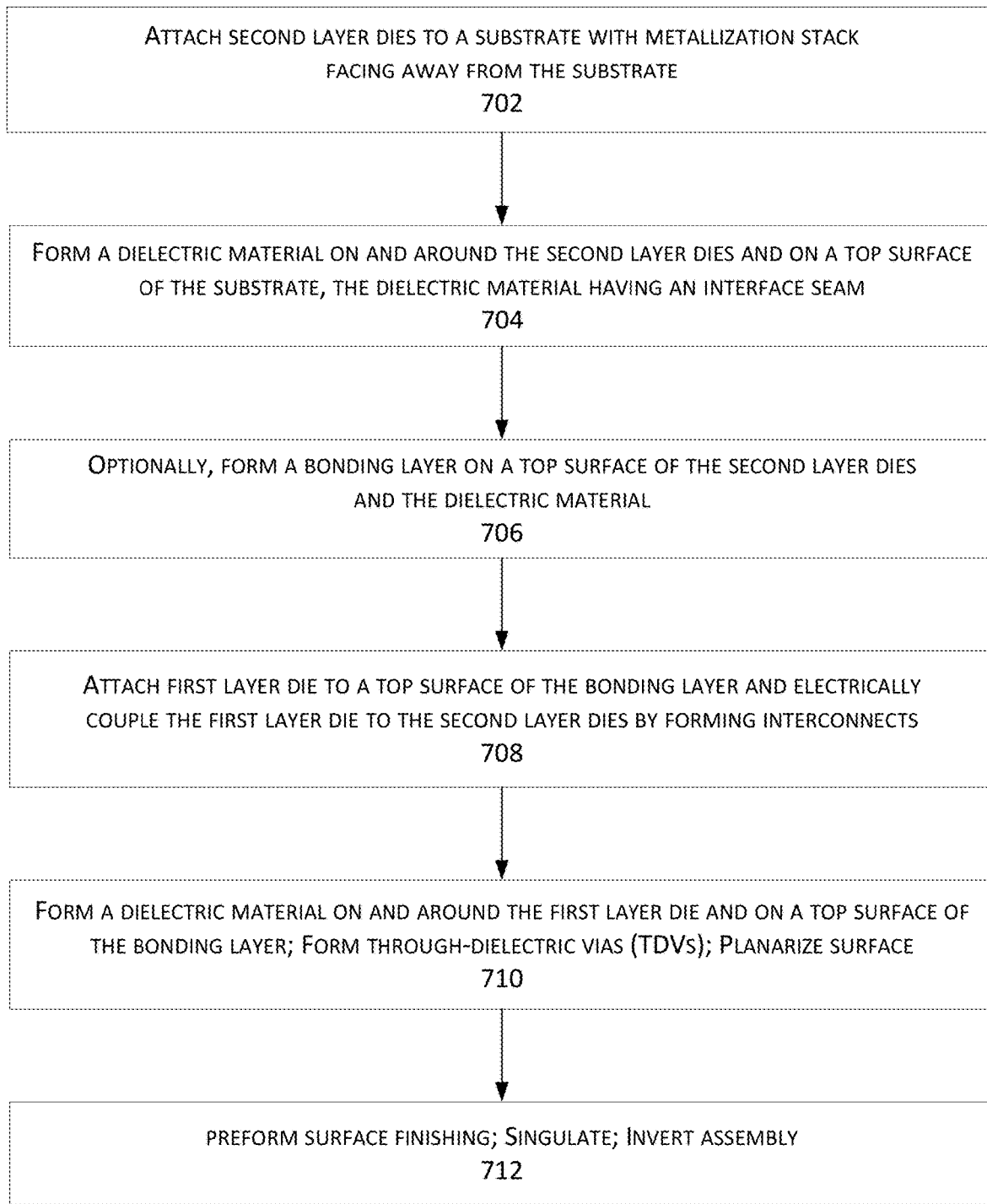
FIG. 7 is a schematic flow diagram listing example operations that may be associated with fabricating a microelectronic assembly according to some embodiments of the present disclosure.

FIG. 7 is a flow diagram of an example method of fabricating an example microelectronic assembly, in accordance with various embodiments. At 702, second layer IC dies 104-2, 104-3 may be attached to a substrate 112. IC dies 104-2, 104-3 may include a metallization stack 116 facing away from the substrate 112. IC dies 104-2, 104-3 may be coupled to the substrate 112 using any suitable technique, including by fusion bonding or by forming hybrid direct bonds.

At 704, a dielectric material 108 is deposited on and around IC second layer dies 104-2, 104-3 and substrate 112. The dielectric material 108 may be deposited using any technique and may be formed having an interface seam 125. A top surface of that dielectric material 108 may be planarized, using CMP or any other suitable process, to expose the bond-pads 134 on IC dies 104-2, 104-3.

At 706, a bonding layer 124 may be formed on a top surface of the IC dies 104-2, 104-3 and dielectric layer 108. Bonding layer 124 may include bond-pads 134 surrounded by a dielectric material 109.

At 708, a first layer IC die 104-1 may be attached to a top surface of bonding layer 124. Interconnects 106 are formed to electrically couple IC die 104-1 to IC dies 104-2, 104-3. Any suitable bonding process may be used to form interconnects 106, such as applying a suitable pressure and heating to a suitable temperature for a duration of time.

At 710, a dielectric material 108 may be disposed on and around IC die 104-1 and a top surface of the bonding layer 124 and forming TDVs 110. The dielectric material 108 may be deposited using any technique and may be formed having an interface seam 125. A top surface of the dielectric material 108 and/or TDVs 110 may be planarized using CMP or any other suitable process.

At 712, the assembly may be singulated, inverted, and surface finishing operations may be performed. In some embodiments, surface finishing operations may be performed prior to singulation. Surface finishing operations may include, for example, forming conductive contacts 144, dispensing solder resist, and attaching solder balls 145 at a bottom surface.

Figure 8:
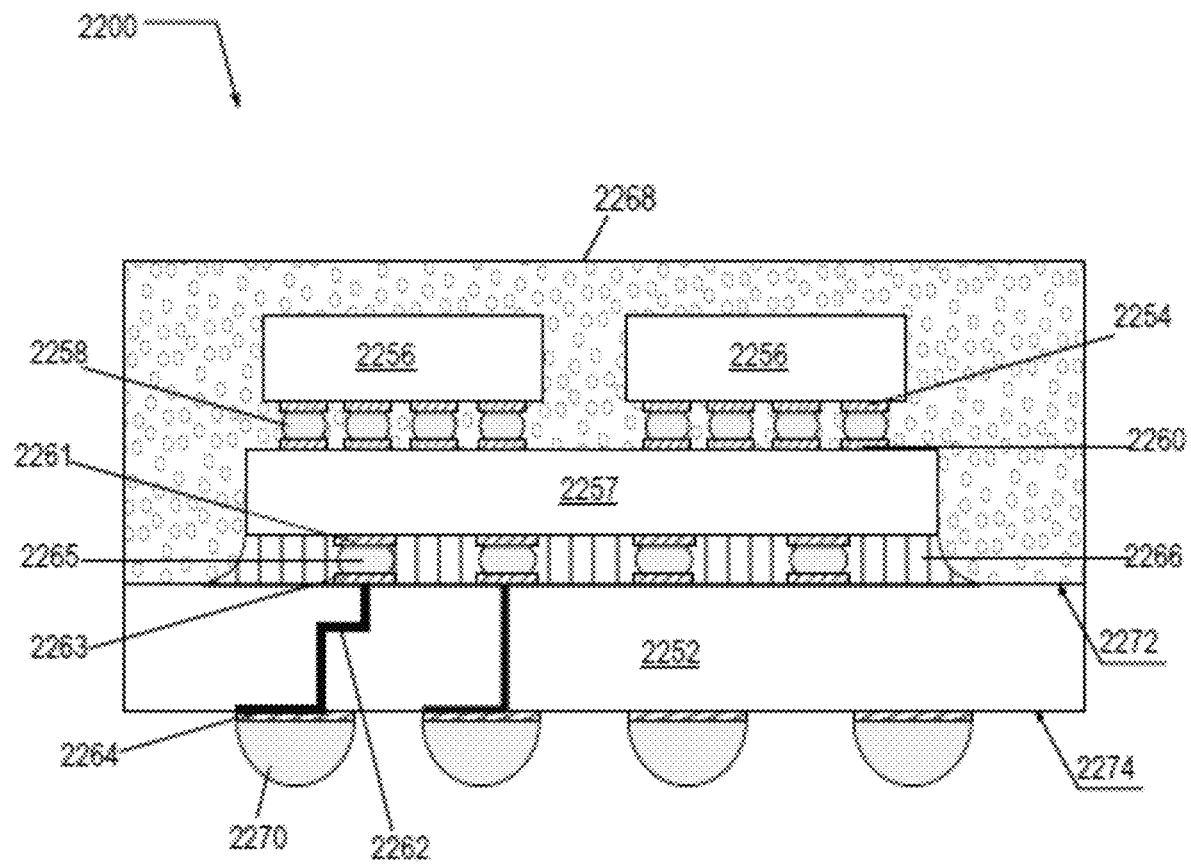
FIG. 8 is a cross-sectional view of a device package that includes one or more microelectronic assemblies in accordance with any of the embodiments disclosed herein.
Figure 9:
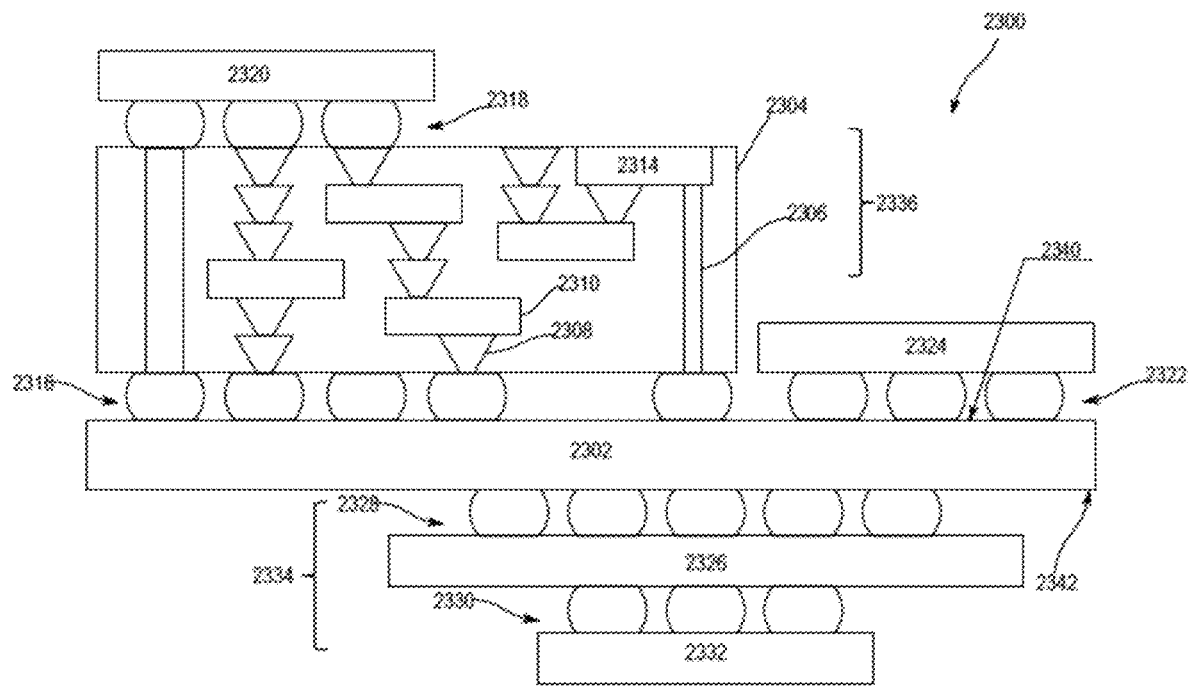
FIG. 9 is a cross-sectional side view of a device assembly that includes one or more microelectronic assemblies in accordance with any of the embodiments disclosed herein.
Figure 10:
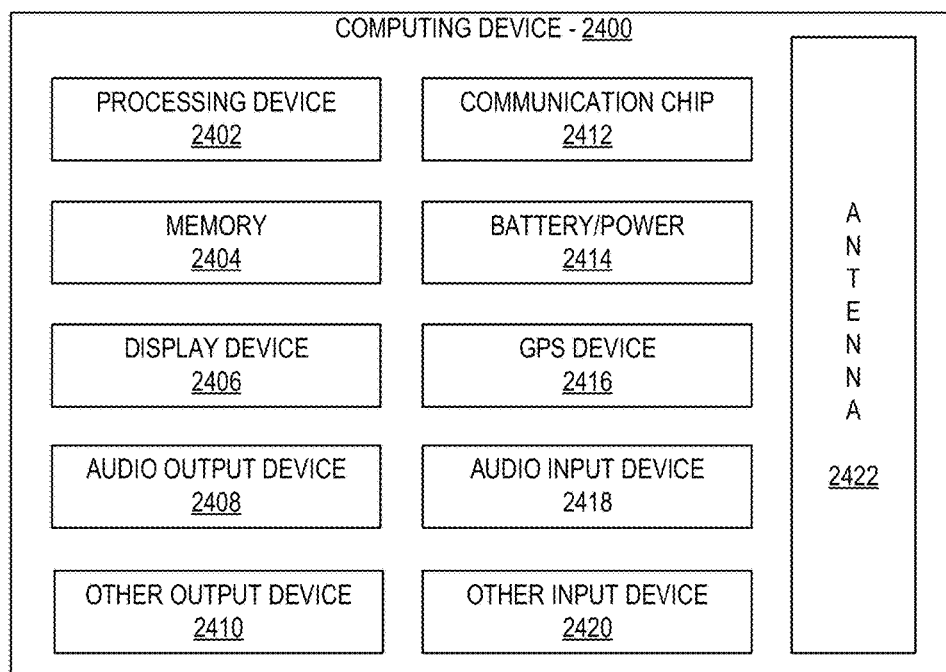
FIG. 10 is a block diagram of an example computing device that includes one or more microelectronic assemblies in accordance with any of the embodiments disclosed herein.

The packages disclosed herein, e.g., any of the microelectronic assemblies 100 or any further embodiments described herein, may be included in any suitable electronic component. FIGS. 8-10 illustrate various examples of packages, assemblies, and devices that may be used with or include any of the IC packages as disclosed herein.

FIG. 8 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 9.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 9 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 8.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 8. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 10 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 8). In yet another example, any one or more of the components of computing device 2400 may include an IC device assembly 2300 (e.g., as shown in FIG. 9).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Example 1 is a microelectronic assembly, including a first die in a first layer, the first layer having a first surface and an opposing second surface, the first die surrounded by a dielectric material; a through-dielectric via (TDV) in the first layer, wherein the TDV has a greater width towards the first surface of the first layer and a smaller width towards the second surface of the first layer; a second die in a second layer, the second layer having a first surface and an opposing second surface, wherein the first surface of the second layer is at the second surface of the first layer, wherein the first die is electrically coupled to the second die by interconnects having a pitch of less than 10 microns between adjacent interconnects, and wherein the second die is surrounded by the dielectric material and includes an interface seam extending from the second die at the second surface of the second layer towards the first surface of the second layer and the interface seam has an angle of less than 90 degrees relative to the second surface of the second layer; and a substrate coupled to the second surface of the second layer.

Example 2 may include the subject matter of Example 1, and may further specify that the dielectric material includes silicon and one or more of nitrogen, oxygen, hydrogen, and carbon; a polyimide material; or a low-k or ultra low-k dielectric.

Example 3 may include the subject matter of Examples 1 or 2, and may further specify that the dielectric material in the first layer is a first dielectric material and the dielectric in the second layer is a second dielectric material different than the first dielectric material.

Example 4 may include the subject matter of any of Examples 1-3, and may further specify that the angle of the interface seam is between 35 degrees and 55 degrees relative to the second surface of the second layer.

Example 5 may include the subject matter of any of Examples 1-4, and may further specify that the interface seam is a first interface seam, and wherein the dielectric material in the second layer further includes a second interface seam extending from the second die at the second surface of the second layer towards the first surface of the second layer and the second interface seam has an angle of less than 90 degrees relative to the second surface of the second layer.

Example 6 may include the subject matter of Example 5, and may further specify that the angle of the second interface seam is between 35 degrees and 55 degrees relative to the second surface of the second layer.

Example 7A may include the subject matter of any of Examples 1-6, and may further specify that the TDV is electrically coupled to the second die.

Example 7B may include the subject matter of any of Examples 1-6, and may further specify that the TDV is one of a plurality of TDVs.

Example 8 may include the subject matter of any of Examples 1-7, and may further include a package substrate electrically coupled to the first surface of the first layer by solder interconnects.

Example 9 may include the subject matter of Example 8, and may further specify that the TDV is electrically coupled to the package substrate at a first end and electrically coupled to the second die at an opposing second end.

Example 10 may include the subject matter of any of Examples 1-9, and may further specify that a material of the substrate includes silicon.

Example 11 is a microelectronic assembly, including a first layer having a first surface and an opposing second surface, the first layer including a first die, a dielectric material around the first die, and a through-dielectric via (TDV), wherein the TDV has a greater width towards the first surface of the first layer and a smaller width towards the second surface of the first layer; and a second layer having a first surface and an opposing second surface, the first surface of the second layer at the second surface of the first layer, the second layer including a second die, a third die, and the dielectric material around and between the second and third dies, wherein the first die is electrically coupled to the second and third dies by interconnects having a pitch of less than 10 microns between adjacent interconnects, wherein the TDV is electrically coupled to the second die, and wherein the dielectric material between the second and third dies includes an interface seam extending from the second die at the second surface of the second layer towards the third die at the first surface of the second layer and the interface seam has an angle of less than 90 degrees relative to the second surface of the second layer.

Example 12 may include the subject matter of Example 11, and may further specify that the dielectric material includes silicon and one or more of nitrogen, oxygen, hydrogen, and carbon; a polyimide material; or a low-k or ultra low-k dielectric.

Example 13 may include the subject matter of Examples 11 or 12, and may further specify that the dielectric material in the first layer is a first dielectric material and the dielectric in the second layer is a second dielectric material different than the first dielectric material.

Example 14 may include the subject matter of any of Examples 11-13, and may further specify that the angle of the interface seam is between 35 degrees and 55 degrees relative to the second surface of the second layer.

Example 15 may include the subject matter of any of Examples 11-14, and may further specify that the interface seam is a first interface seam, and wherein the dielectric material between the second and third dies further includes a second interface seam extending from the third die at the second surface of the second layer towards the second die at the first surface of the second layer and the second interface seam has an angle of less than 90 degrees relative to the second surface of the second layer.

Example 16 may include the subject matter of Example 15, and may further specify that the angle of the second interface seam is between 35 degrees and 55 degrees relative to the second surface of the second layer.

Example 17 may include the subject matter of any of Examples 11-16, and may further specify that the TDV is one of a plurality of TDVs.

Example 18 may include the subject matter of any of Examples 11-17, and may further include a package substrate electrically coupled to the first surface of the first layer by solder interconnects.

Example 19 may include the subject matter of any of Examples 11-18, and may further include a substrate coupled to the second surface of the second layer.

Example 20 may include the subject matter of Example 19, and may further specify that a material of the substrate includes silicon.

Example 21 may include the subject matter of Example 19, and may further specify that the substrate is bonded to the second surface of the second layer.

Example 22 may include the subject matter of Example 19, and may further specify that the substrate is coupled to the second die by second interconnects having a pitch of less than 10 microns between adjacent second interconnects.

Example 23 may include the subject matter of Example 22, and may further specify that the substrate further includes conductive pathways and the conductive pathways are electrically coupled to the second die by the second interconnects.

Example 24 may include the subject matter of Example 23, and may further specify that the conductive pathways in the substrate are further electrically coupled to the third die by third interconnects having a pitch of less than 10 microns between adjacent third interconnects.

Example 25 is a microelectronic assembly, including a first die in a first layer, the first layer having a first surface and an opposing second surface, the first die surrounded by a dielectric material; a through-dielectric via (TDV) in the first layer, wherein the TDV has a greater width towards the first surface of the first layer and a smaller width towards the second surface of the first layer; a second die in a second layer, the second layer having a first surface and an opposing second surface, wherein the first surface of the second layer is at the second surface of the first layer, wherein the first die is electrically coupled to the second die by first interconnects having a pitch of less than 10 microns between adjacent first interconnects, and wherein the second die is surrounded by the dielectric material and includes an interface seam extending from the second die at the second surface of the second layer towards the first surface of the second layer and the interface seam has an angle of less than 90 degrees relative to the second surface of the second layer; a substrate coupled to the second surface of the second layer; and a package substrate electrically coupled to the first surface of the first layer by second interconnects.

Example 26 may include the subject matter of Example 25, and may further specify that a material of the substrate includes silicon.

Example 27 may include the subject matter of Examples 25 or 26, and may further specify that the substrate is bonded to the second surface of the second layer.

Example 28 may include the subject matter of Examples 25 or 26, and may further specify that the substrate is coupled to the second die by second interconnects having a pitch of less than 10 microns between adjacent second interconnects.

Example 29 may include the subject matter of Example 28, and may further specify that the substrate further includes conductive pathways and the conductive pathways are electrically coupled to the second die by the second interconnects.

Example 30 is a method of manufacturing a microelectronic assembly, including bonding a second die and a third die to a substrate, wherein the second die and the third die include a first surface having conductive contacts and an opposing second surface, and wherein the first surfaces of the second and third dies are facing away from the substrate; depositing a dielectric material around and between the second and third dies and exposing the conductive contacts, wherein depositing the dielectric material around and between the second and third dies includes forming an interface seam between the second and third dies, wherein the interface seam extends from second surface of the second die towards the first surface of the third die, and wherein the interface seam has an angle of less than 90 degrees relative to the substrate; attaching a first die to the second and third dies by forming interconnects to electrically couple conductive contacts of the first die to the conductive contacts of the second and third dies, wherein the interconnects having a pitch of less than 10 microns between adjacent interconnects; and depositing the dielectric material around the first die.

Example 31 may include the subject matter of Example 30, and may further specify that forming the interconnects further includes forming an interface layer having bond-pads and a dielectric material on the second and third dies, and forming metal-metal bonds and dielectric-dielectric bonds with the interface layer.

Example 32 may include the subject matter of Examples 30 or 31, and may further specify that depositing the dielectric material around and between the second and third dies further includes forming a second interface seam between the second and third dies, wherein the second interface seam extends from second surface of the third die towards the first surface of the second die, and wherein the second interface seam has an angle of less than 90 degrees relative to the substrate.

Example 33 may include the subject matter of any of Examples 30-32, and may further include forming a through-dielectric via (TDV) in the dielectric material adjacent to the first die, wherein the TDV is electrically coupled the first surface of the second die, and wherein the TDV has a smaller width towards the first surface of the second die.

Example 34 may include the subject matter of any of Examples 30-33, and may further specify that the dielectric material includes silicon and one or more of nitrogen, oxygen, hydrogen, and carbon; a polyimide material; or a low-k or ultra low-k dielectric.

Example 35 may include the subject matter of Example 33, and may further include electrically coupling a package substrate to the first die and the TDV.

The invention claimed is:

1. A microelectronic assembly, comprising:
   a first die in a first layer, the first layer having a first surface and an opposing second surface, the first die surrounded by a dielectric material;
   a through-dielectric via (TDV) in the first layer, wherein the TDV has a greater width towards the first surface of the first layer and a smaller width towards the second surface of the first layer;
   a second die in a second layer, the second layer having a first surface and an opposing second surface, wherein the first surface of the second layer is at the second surface of the first layer, wherein the first die is electrically coupled to the second die by interconnects having a pitch of less than 10 microns between adjacent interconnects, and wherein the second die is surrounded by the dielectric material and includes an interface seam extending from the second die at the second surface of the second layer towards the first surface of the second layer and the interface seam has an angle of less than 90 degrees relative to the second surface of the second layer; and
   a substrate coupled to the second surface of the second layer.

2. The microelectronic assembly of claim 1, wherein the dielectric material includes silicon and one or more of nitrogen, oxygen, and carbon; a polyimide material; or a low-k or ultra low-k dielectric.

3. The microelectronic assembly of claim 1, wherein the dielectric material in the first layer is a first dielectric material and the dielectric in the second layer is a second dielectric material different than the first dielectric material.

4. The microelectronic assembly of claim 1, wherein the angle of the interface seam is between 35 degrees and 55 degrees relative to the second surface of the second layer.

5. The microelectronic assembly of claim 1, wherein the interface seam is a first interface seam, and wherein the dielectric material in the second layer further includes a second interface seam extending from the second die at the second surface of the second layer towards the first surface of the second layer and the second interface seam has an angle of less than 90 degrees relative to the second surface of the second layer.

6. The microelectronic assembly of claim 5, wherein the angle of the second interface seam is between 35 degrees and 55 degrees relative to the second surface of the second layer.

7. The microelectronic assembly of claim 1, wherein the TDV is electrically coupled to the second die.

8. The microelectronic assembly of claim 1, further comprising:
   a package substrate electrically coupled to the first surface of the first layer by solder interconnects.

9. The microelectronic assembly of claim 8, wherein the TDV is electrically coupled to the package substrate at a first end and electrically coupled to the second die at an opposing second end.

10. The microelectronic assembly of claim 1, wherein a material of the substrate includes silicon.

11. A microelectronic assembly, comprising:
    a first layer having a first surface and an opposing second surface, the first layer including a first die, a dielectric material around the first die, and a through-dielectric via (TDV), wherein the TDV has a greater width towards the first surface of the first layer and a smaller width towards the second surface of the first layer; and a second layer having a first surface and an opposing second surface, the first surface of the second layer at the second surface of the first layer, the second layer including a second die, a third die, and the dielectric material on and between the second and third dies, wherein the first die is electrically coupled to the second and third dies by interconnects having a pitch of less than 10 microns between adjacent interconnects, wherein the TDV is electrically coupled to the second die, and wherein the dielectric material between the second and third dies includes an interface seam extending from the second die at the second surface of the second layer towards the third die at the first surface of the second layer and the interface seam has an angle of less than 90 degrees relative to the second surface of the second layer.

12. The microelectronic assembly of claim 11, wherein the angle of the interface seam is between 35 degrees and 55 degrees relative to the second surface of the second layer.

13. The microelectronic assembly of claim 11, wherein the interface seam is a first interface seam, and wherein the dielectric material between the second and third dies further includes a second interface seam extending from the third die at the second surface of the second layer towards the second die at the first surface of the second layer and the second interface seam has an angle of less than 90 degrees relative to the second surface of the second layer.

14. The microelectronic assembly of claim 13, wherein the angle of the second interface seam is between 35 degrees and 55 degrees relative to the second surface of the second layer.

15. The microelectronic assembly of claim 11, further comprising:

a substrate coupled to the second surface of the second layer by second interconnects having a pitch of less than 10 microns between adjacent second interconnects.

16. The microelectronic assembly of claim 15, wherein the substrate further includes conductive pathways and the conductive pathways are electrically coupled to the second die by the second interconnects.

17. A microelectronic assembly, comprising:

a first die in a first layer, the first layer having a first surface and an opposing second surface, the first die surrounded by a dielectric material;

a through-dielectric via (TDV) in the first layer, wherein the TDV has a greater width towards the first surface of the first layer and a smaller width towards the second surface of the first layer;

a second die in a second layer, the second layer having a first surface and an opposing second surface, wherein the first surface of the second layer is at the second surface of the first layer, wherein the first die is electrically coupled to the second die by first interconnects having a pitch of less than 10 microns between adjacent first interconnects, and wherein the second die is surrounded by the dielectric material and includes an interface seam extending from the second die at the second surface of the second layer towards the first surface of the second layer and the interface seam has an angle of less than 90 degrees relative to the second surface of the second layer;

a substrate coupled to the second surface of the second layer; and a package substrate electrically coupled to the first surface of the first layer by second interconnects.

18. The microelectronic assembly of claim 17, wherein a material of the substrate includes silicon.

19. The microelectronic assembly of claim 17, wherein the substrate is coupled to the second die by second interconnects having a pitch of less than 10 microns between adjacent second interconnects.

20. The microelectronic assembly of claim 19, wherein the substrate further includes conductive pathways and the conductive pathways are electrically coupled to the second die by the second interconnects.

* * * * *